(12) United States Patent
Watanabe et al.

(10) Patent No.: US 8,525,223 B2
(45) Date of Patent: Sep. 3, 2013

(54) SILICON CARBIDE SEMICONDUCTOR DEVICE

(75) Inventors: Hiroki Watanabe, Tokai (JP);
Shinichiro Miyahara, Nisshin (JP);
Masahiro Sugimoto, Toyota (JP);
Hidefumi Takaya, Miyoshi (JP);
Yukihiko Watanabe, Nagoya (JP);
Narumasa Soejima, Seto (JP); Tsuyoshi Ishikawa, Nisshin (JP)

(73) Assignees: DENSO CORPORATION, Kariya (JP);
Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/450,639

(22) Filed: Apr. 19, 2012

(65) Prior Publication Data

US 2012/0273801 A1 Nov. 1, 2012

(30) Foreign Application Priority Data

Apr. 28, 2011 (JP) ................................. 2011-101207

(51) Int. Cl.
*H01L 21/02* (2006.01)

(52) U.S. Cl.
USPC .... 257/130; 257/135; 257/301; 257/E29.084; 257/E29.243; 257/E29.313

(58) Field of Classification Search
USPC .......... 257/130–135, 301, 330, 341, E21.041, 257/29.084, 104, 243–262, 313, 346
See application file for complete search history.

(56) References Cited

U.S. PATENT DOCUMENTS

| | | | |
|---|---|---|---|
| 5,736,753 A | 4/1998 | Ohno et al. | |
| 6,906,356 B1 * | 6/2005 | Chang | 257/130 |
| 7,135,740 B2 * | 11/2006 | Chang | 257/341 |
| 2007/0012983 A1 * | 1/2007 | Yang et al. | 257/301 |
| 2008/0197407 A1 * | 8/2008 | Challa et al. | 257/330 |
| 2008/0220620 A1 | 9/2008 | Kawada et al. | |
| 2009/0042375 A1 | 2/2009 | Sawada et al. | |
| 2009/0272983 A1 * | 11/2009 | Kumar et al. | 257/77 |
| 2010/0200866 A1 | 8/2010 | Kitou et al. | |
| 2012/0161154 A1 * | 6/2012 | Mimura et al. | 257/77 |
| 2012/0181551 A1 * | 7/2012 | Miyahara et al. | 257/77 |
| 2012/0220091 A1 * | 8/2012 | Challa et al. | 438/270 |
| 2012/0282746 A1 * | 11/2012 | Hebert | 438/270 |

FOREIGN PATENT DOCUMENTS

| | | |
|---|---|---|
| JP | A-2000-294777 | 10/2000 |
| JP | A-2008-294210 | 12/2008 |
| JP | A-2009-289987 | 12/2009 |

OTHER PUBLICATIONS

German Office Action dated Nov. 6, 2012 issued from the German Patent Office in the corresponding German patent application No. 10 2012 205 879.6 (with English translation).

* cited by examiner

*Primary Examiner* — Michael Lebentritt
(74) *Attorney, Agent, or Firm* — Posz Law Group, PLC (57) ABSTRACT

A SiC semiconductor device includes: a SiC substrate including a first or second conductive type layer and a first conductive type drift layer and including a principal surface having an offset direction; a trench disposed on the drift layer and having a longitudinal direction; and a gate electrode disposed in the trench via a gate insulation film. A sidewall of the trench provides a channel formation surface. The vertical semiconductor device flows current along with the channel formation surface of the trench according to a gate voltage applied to the gate electrode. The offset direction of the SiC substrate is perpendicular to the longitudinal direction of the trench.

7 Claims, 10 Drawing Sheets

OFF DIR
<11-20>

SILICON CARBIDE SEMICONDUCTOR DEVICE

CROSS REFERENCE TO RELATED APPLICATION

This application is based on Japanese Patent Application No. 2011-101207 filed on Apr. 28, 2011, the disclosure of which is incorporated herein by reference.

TECHNICAL FIELD

The present disclosure relates to a silicon carbide semiconductor device having a trench gate type MOSFET.

BACKGROUND

In a SiC (silicon carbide) semiconductor device, it is effective to increase a channel density for flowing a large current. In view of this point, a trench gate type MOSFET is used for a silicon transistor. The SiC semiconductor device may have a trench gate structure. Thus, a vertical type MOSFET having a trench gate structure made of SiC is proposed in JP-A-2008-177538, JP-A-2008-294210 and JP-A-2009-289987.

However, when the vertical type MOSFET having the trench gate structure is manufactured, a concavity and a convexity may be formed on a sidewall and/or a bottom of a trench. Thus, a gate insulation film disposed on the sidewall and the bottom of the trench may have low insulation withstand voltage and low lifetime. Since the breakdown electric field intensity of the SiC semiconductor device is ten times larger than the silicon semiconductor device, the SiC semiconductor device is used under a condition that a voltage almost ten times larger than that of the silicon semiconductor device is applied to the SiC semiconductor device. Accordingly, the electric field having the intensity ten times larger than that in the gate insulation film of the silicon semiconductor device is applied to the gate insulation film of the SiC semiconductor device. Thus, the insulation withstand voltage and the lifetime of the gate insulation film become important.

SUMMARY

It is an object of the present disclosure to provide a SiC semiconductor device having a gate insulation film on a sidewall and a bottom of a trench. A concavity and a convexity on the sidewall and the bottom of the trench are restricted, so that an insulation withstand voltage and a lifetime of the gate insulation film are improved.

A silicon carbide semiconductor device having a vertical semiconductor element with a trench gate structure includes: a silicon carbide semiconductor substrate including a first or second conductive type layer and a drift layer on the first or second conductive type layer, wherein the drift layer has the first conductive type, and the silicon carbide semiconductor substrate includes a principal surface having an offset direction; a trench disposed on a surface of the drift layer and having a longitudinal direction; and a gate electrode disposed in the trench via a gate insulation film. A sidewall of the trench provides a channel formation surface. The vertical semiconductor device is configured to flow current along with the channel formation surface of the trench according to a gate voltage applied to the gate electrode. The offset direction of the silicon carbide semiconductor substrate is perpendicular to the longitudinal direction of the trench.

In the device, a concavity and a convexity on a sidewall and a bottom of the trench are restricted, so that an insulation withstand voltage and a lifetime of the gate insulation film are improved.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The present inventors have studied about a factor for forming a concavity and a convexity on a sidewall and/or a bottom of a trench in a SiC semiconductor device. The step-bunching phenomena on the surface of the SiC semiconductor substrate may provide to form the concavity and the convexity. This process will be explained with reference to FIGS. 8A and 8B.

Figure 8A:
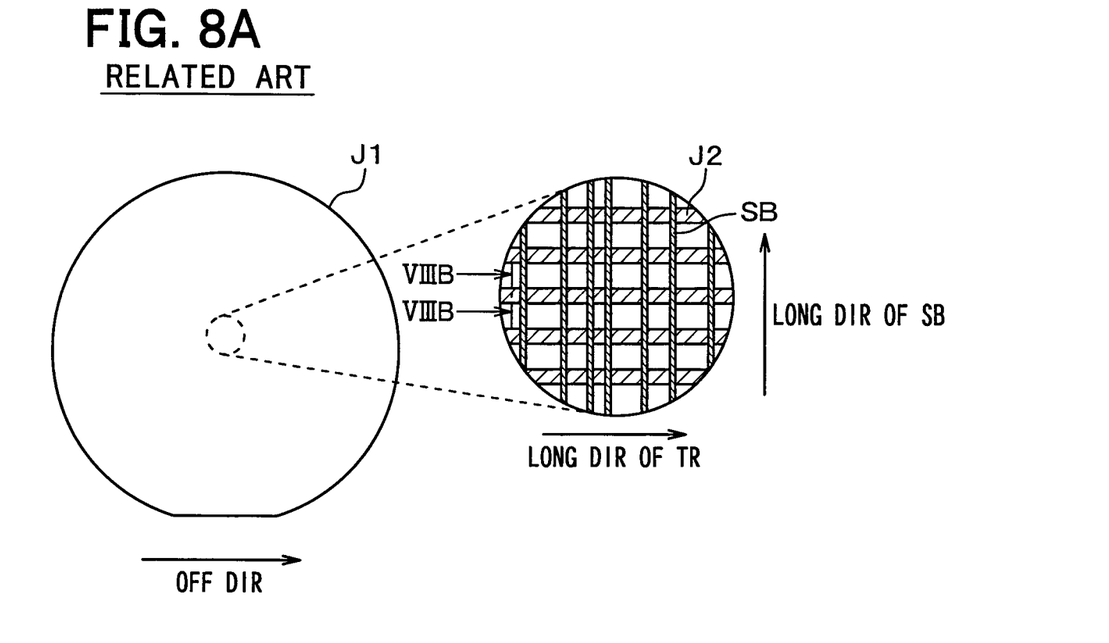
FIG. 8A is a diagram showing an upper surface layout of a SiC semiconductor substrate when a trench is formed according to a related art.
Figure 8B:
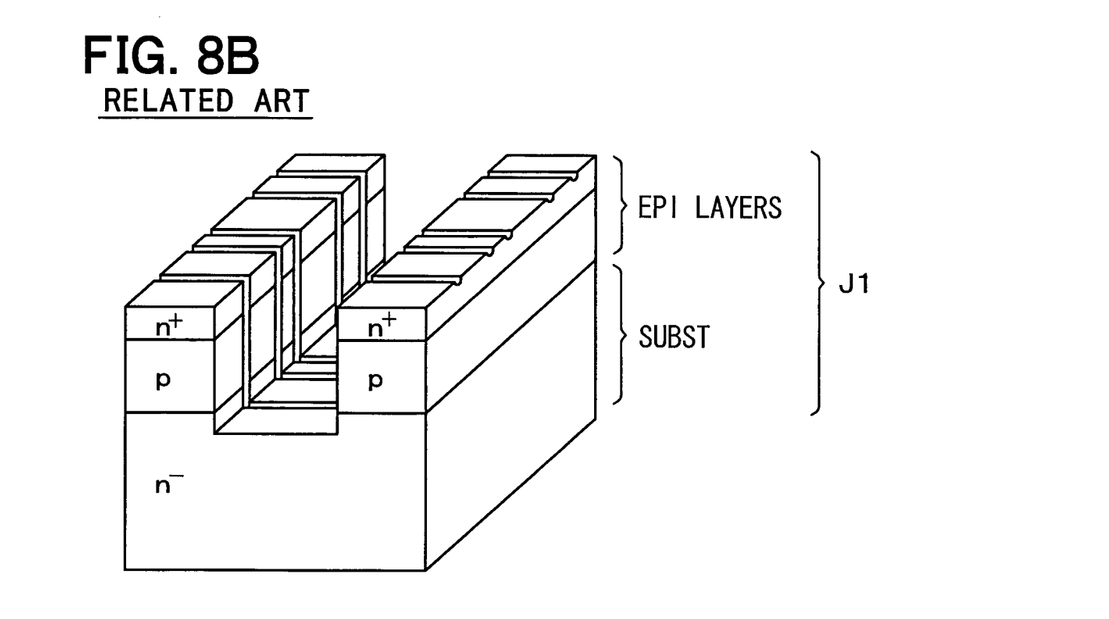
FIG. 8B is a diagram showing a cross sectional view of the substrate taken along line VIIIB-VIIIB in FIG. 8A.

FIG. 8A shows an upper surface layout of the SiC semiconductor substrate J1 when a trench J2 is formed on the surface of the substrate J1. FIG. 8B shows a cross sectional view of the substrate J1 taken along line VIIIB-VIIIB in FIG. 8A.

The substrate J1 is an offset substrate having an offset angle in order to epitaxially grow the SiC crystal on the surface of the substrate J1. As shown in FIG. 8A, the substrate J1 has an offset direction. A longitudinal direction of the trench J2 is in parallel to the offset direction.

Figure 9A:
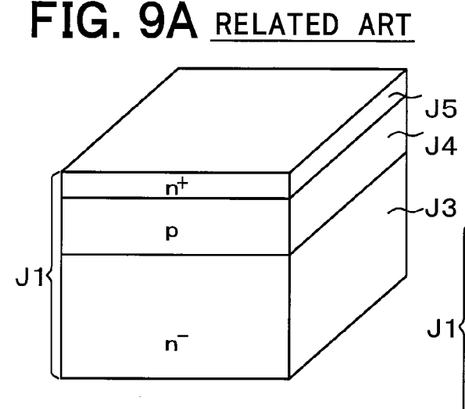
FIGS. 9A to 9F are diagrams showing a part of a manufacturing method of a vertical MOSFET having a trench gate structure according to the related art.
Figure 9B:
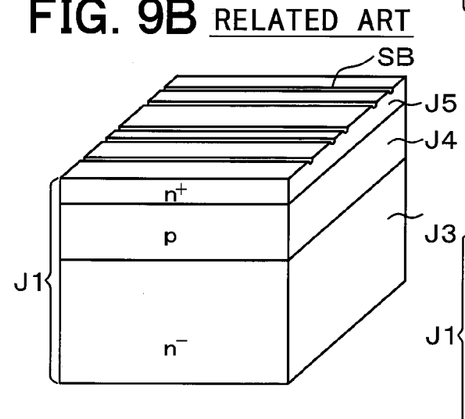
Figure 9C:
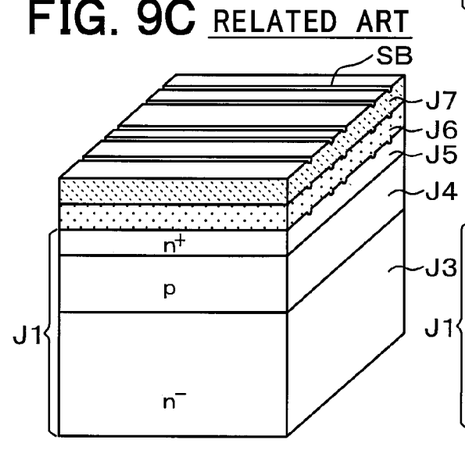
Figure 9D:
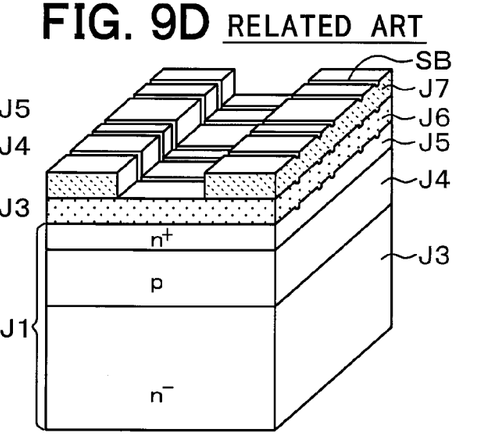
Figure 9E:
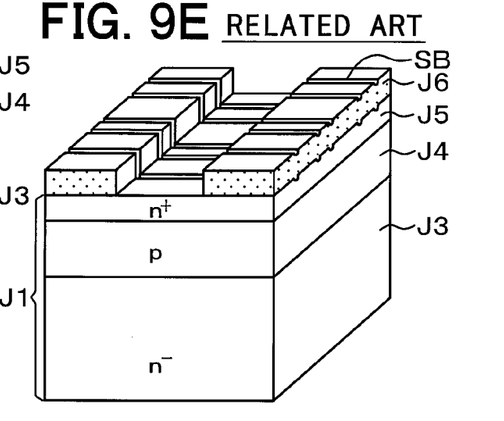
Figure 9F:
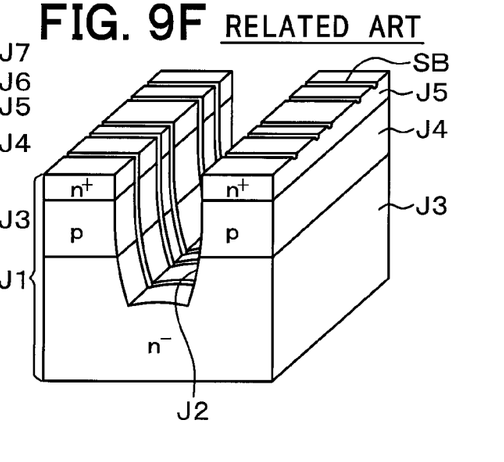

In the SiC semiconductor device having a trench gate type vertical MOSFET, an ion implantation step and an activation annealing step are performed in order to actuate species of ion implantation. Further, an oxide film forming step, a photo lithography step, a mask forming step for patterning the oxide film, a trench etching step with using the oxide film mask are performed in order to form the trench. FIGS. 9A to 9F show these steps. As shown in FIG. 9A, ions are implanted in a surface portion of the substrate J1 having a N− conductive type drift layer J3 so that a P conductive type base region J4 and a N+ conductive type source region 35. Then, as shown in FIG. 9B, an activation annealing step is performed. Then, as shown in FIG. 9C, an oxide film J6 and a resist J7 are formed on the substrate J1. As shown in FIG. 9D, the resist 37 is patterned by a photo-lithography method. As shown in FIG. 9E, the oxide film 36 is etched using the resist 37 as a mask. As shown in FIG. 9F, the trench J2 is formed using the oxide film 36 as a mask.

Thus, the trench J2 is formed. In this case, as shown in FIG. 9B, at the activation annealing step before forming the trench J2, an atomic scale step, which is preliminarily formed on the surface of the offset substrate, i.e., the substrate J1, is disordered and grown. Thus, a step bunching phenomena occurs, and a step bunching portion SB is formed. A shape of the step bunching portion SB is transferred to the surface of the oxide film J6 as a mask for a trench etching step. When the trench etching step is performed, the shape of the step bunching portion is also transferred to the sidewall and the bottom of the trench J2. An etching gas molecule such as a plasma particle is concentrated at the bottom and the corner of the step bunching portion, so that the etching speed increases. Thus, since the bottom and the corner of the step bunching portion SB is excessively etched so that the convexity and the concavity are formed on the sidewall of the trench J2. Further, the convexity and the concavity are formed on the bottom of the trench J2 from the convexity and the concavity on the sidewall as an origin.

To reduce the influence of the step bunching portion SB, JP-A-2000-294777 teaches that a channel in a planar type MOSFET is arranged to move a carrier along with a direction in parallel to the longitudinal direction of the step bunching portion SB. In this case, although the channel mobility is improved, the insulation withstand voltage and the lifetime of the gate insulation film are not improved.

To reduce the influence of the step bunching portion SB, JP-A-2009-65112 teaches a method such that a carbon film is formed on a whole of the surface of the substrate by a CVD method, and then, an activation annealing step is performed. In this case, the step bunching portion is not reduced sufficiently. Further, the number of manufacturing steps increases.

First Embodiment

In view of the above difficulties, a SiC semiconductor device according to a first embodiment will be explained. Here, the SiC semiconductor device is, for example, an inversion MOSFET having a trench gate structure.

Figure 1:
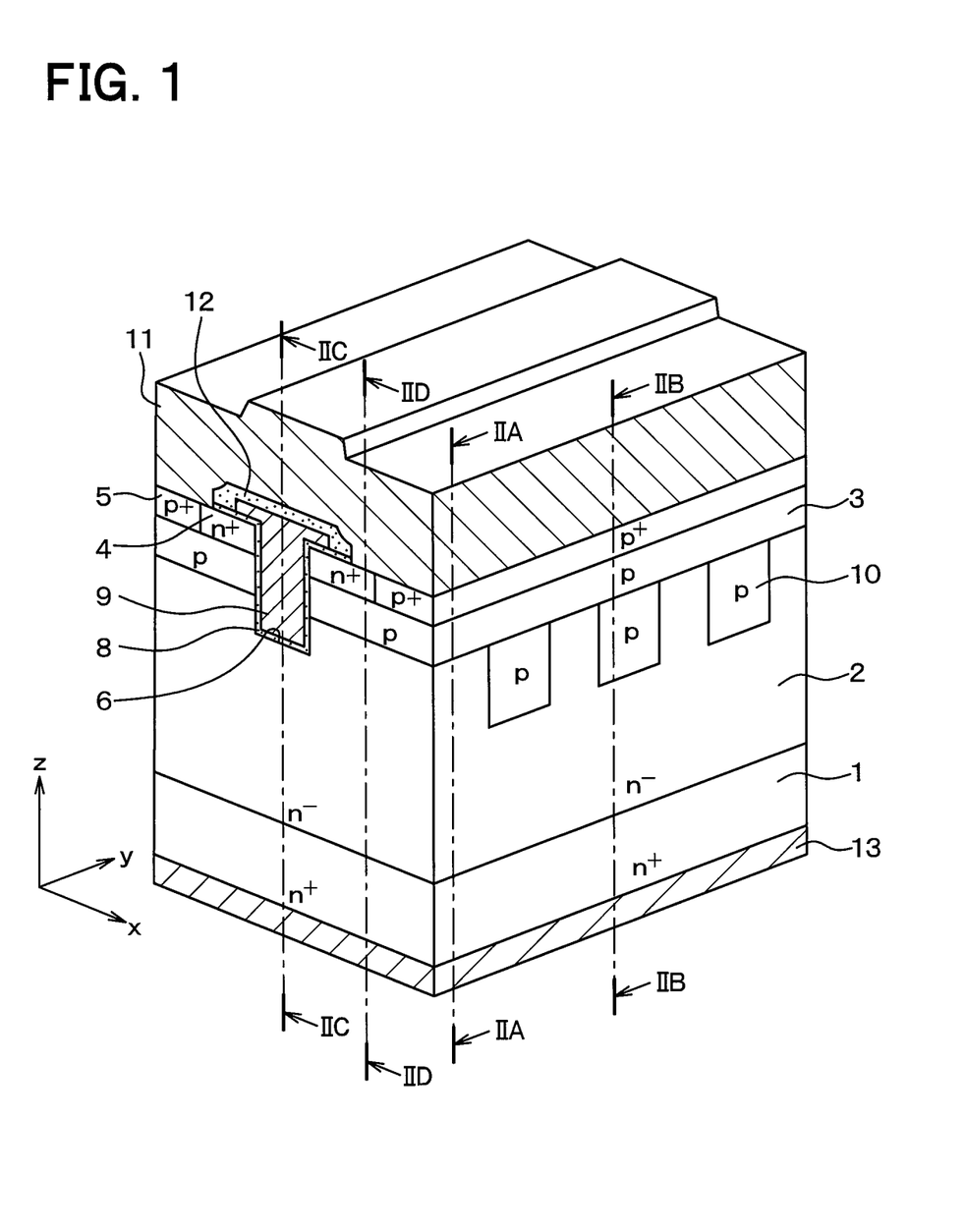
FIG. 1 is a diagram showing a MOSFET having a trench gate structure according to a first embodiment.
Figure 2A:
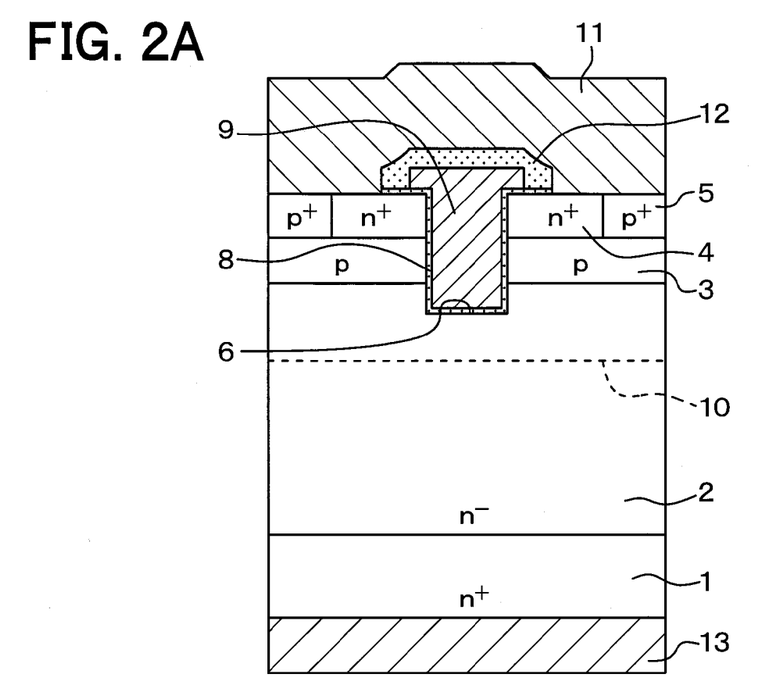
FIG. 2A is a diagram showing a cross sectional view of the MOSFET taken along line IIA-IIA in FIG. 1.
Figure 2B:
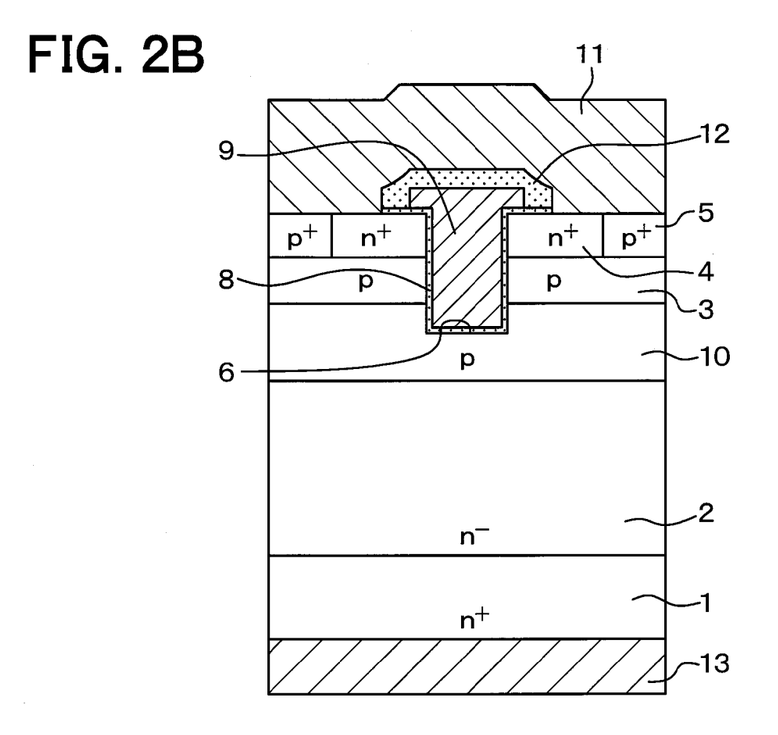
FIG. 2B is a diagram showing a cross sectional view of the MOSFET taken along line IIB-IIB in FIG. 1.
Figure 2C:
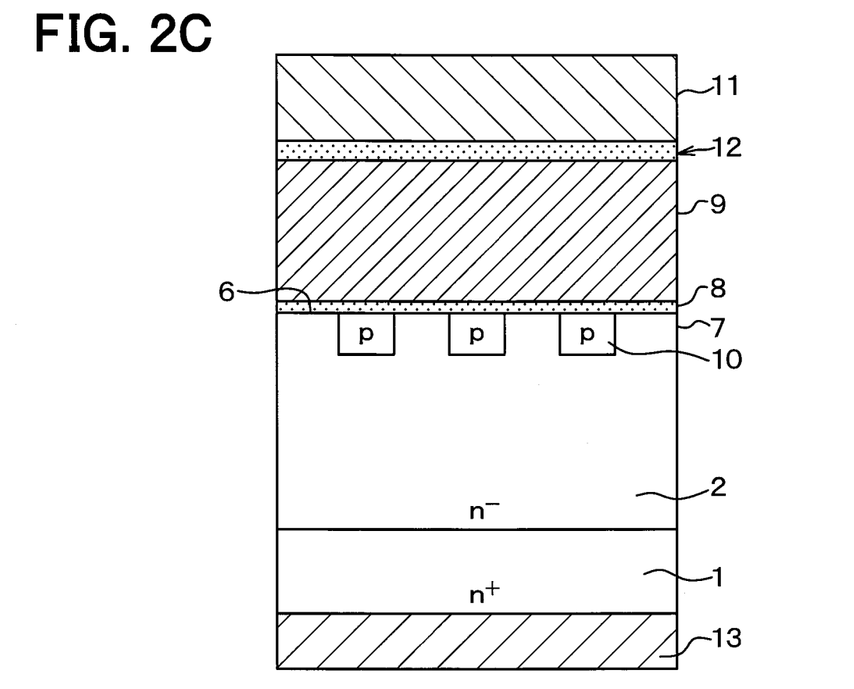
FIG. 2C is a diagram showing a cross sectional view of the MOSFET taken along line IIC-IIC in FIG. 1.
Figure 2D:
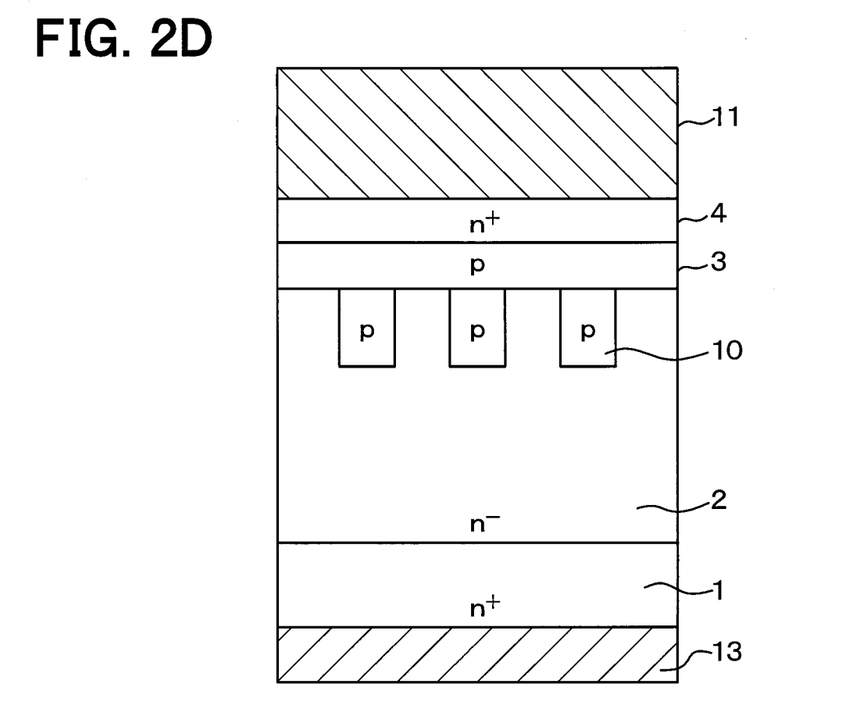
FIG. 2D is a diagram showing a cross sectional view of the MOSFET taken along line IID-IID in FIG. 1.

FIG. 1 shows a part of the MOSFET according to the present embodiment. The part in FIG. 1 corresponds to one of cells in the MOSFET. Although FIG. 1 shows only one cell in the MOSFET, multiple cells are arranged along with one direction. FIGS. 2A to 2D show cross sectional views of the MOSFET. FIG. 2A shows a cross sectional view of the MOSFET taken along line IIA-IIA in FIG. 1 on a plane in parallel to a X-Z plane. FIG. 2B shows a cross sectional view of the MOSFET taken along line IIB-IIB in FIG. 1 on a plane in parallel to a X-Z plane. FIG. 2C shows a cross sectional view of the MOSFET taken along line IIC-IIC in FIG. 1 on a plane in parallel to a Y-Z plane. FIG. 2D shows a cross sectional view of the MOSFET taken along line IID-IID in FIG. 1 on a plane in parallel to a Y-Z plane.

The MOSFET shown in FIGS. 1 to 2D includes a N+ conductive type substrate 1 made of SiC as a semiconductor substrate. The substrate 1 has a N conductive type impurity concentration such as a phosphorus impurity concentration of, for example, $1.0 \times 10^{19}/cm^3$. The thickness of the substrate 1 is about 300 micrometers. The substrate 1 has a principal surface of a Si-plane. The substrate 1 is an offset substrate having an offset angle. The offset direction is <11−20>-direction.

A N− conductive type drift layer 2 is formed on the surface of the substrate 1. The drift layer 2 has a N conductive type impurity concentration such as a phosphorus impurity concentration of, for example, $3.0-7.0 \times 10^{15}/cm^3$. The thickness of the drift layer 2 is about 10 micrometers to 15 micrometers. The drift layer 2 is formed by an epitaxial growth method, so that a crystal structure on the surface of the substrate 1 is transferred to the drift layer 2. Thus, the surface of the drift layer 2 also has the offset angle with an offset direction of the <11−20>-direction. The impurity concentration of the drift layer 2 may be constant along with a depth direction. Alternatively, the concentration distribution of the drift layer 2 may have a gradient. For example, a concentration of a part of the drift layer 2 near the substrate 1 is higher than that of the drift layer far from the substrate 1. Specifically, for example, an impurity concentration of a part of the drift layer 2 from the surface of the substrate 1 to a certain depth such as 3 micrometer-depth to 5 micrometer-depth is about $2.0 \times 10^{15}/cm^3$. In this case, since the internal resistance of the drift layer 2 is reduced, the on-state resistance becomes low.

A P conductive type base region 3 is formed in a surface portion of the drift layer 2. Further, a N+ conductive type source region 4 and a P+ conductive type contact layer 5 are formed in an upper portion of the base region 3. In the present embodiment, the substrate 1 and the drift layer 2 are made of SiC, and they provide a SiC semiconductor substrate. An impurity ion is implanted in a surface portion of the SiC semiconductor substrate. Then, an activation annealing step is performed, so that the base region 3, the source region 4 and the contact layer 5 are formed as impurity layers.

The base region 3 has a P conductive type impurity concentration such as a boron impurity concentration or an aluminum impurity concentration of, for example, $5.0 \times 10^{16}/cm^3$ to $2.0 \times 10^{19}/cm^3$. The thickness of the base region 3 is about 2.0 micrometers. The source region 4 has a N conductive type impurity concentration (i.e., a surface concentration), such as a phosphorous impurity concentration at a surface portion of the source region 4, of, for example, $1.0 \times 10^{21}/cm^3$. The thickness of the source region 4 is about 0.3 micrometers. The contact layer 5 has a P conductive type impurity concentration (i.e., a surface concentration), such as a born or aluminum impurity concentration at a surface portion of the contact layer 5, of, for example, $1.0 \times 10^{21}/cm^3$. The thickness of the contact layer 5 is about 0.3 micrometers. The source region 4 is arranged on both sides of a trench gate structure. The contact layer 5 is disposed on an opposite side of the trench gate structure via the source region 4. The source region 4 and the contact layer 5 extend along with the Y direction as a longitudinal direction, as shown in FIG. 1.

A trench 6 is formed to penetrate the base region 3 and the source region 4 and to reach the drift layer 2. The width of the trench 6 is, for example, 1.4 micrometers to 2.0 micrometers.

The depth of the trench 6 is equal to or larger than 2.0 micrometers. For example, the depth of the trench 6 is 2.4 micrometers. The base region 3 and the source region 4 are arranged on the both sides of the trench 6 to contact the sidewall of the trench 6.

Further, an inner wall of the trench 6 is covered with a gate oxide film 8 as a gate insulation film. A gate electrode 9 is formed on the surface of the gate oxide film 8. The gate electrode 9 is made of doped poly-silicon. Thus, the gate electrode 9 fills the trench 6. The gate oxide film 8 is formed by thermally oxidizing the inner wall of the trench 6. The thickness of the gate oxide film 8 on the sidewall and the bottom of the trench 6 is about 100 nanometers.

Thus, the trench gate structure is formed. The trench gate structure extends along with the Y direction as a longitudinal direction in FIG. 1.

Specifically, the trench 6 has the longitudinal direction of the <1−100>-direction, which is perpendicular to the <11−20>-direction. The <1−100>-direction is in parallel to the Y direction in FIG. 1. When the longitudinal direction of the trench 6 is the <1−100>-direction, the sidewall of the trench 6, i.e., a channel forming surface has a (11−20)-plane. The channel mobility on the (11−20)-plane is high, so that the on-state resistance is reduced. Multiple trench gate structures are arranged along with the X direction such that the structures are in parallel to each other. Thus, the multiple trench gate structures provide a stripe pattern. Further, the source region 4 and the contact layer 5 also extend along with the longitudinal direction of the trench gate structure.

Further, a P conductive type deep layer 10 is formed in a part of the drift layer 2 under the base region 3. The deep layer 10 extends along with a direction crossing the longitudinal direction of the trench gate structure. In the present embodiment, the deep layer 10 extends along with a normal direction of a channel forming portion on the sidewall of the trench 6. Specifically, the deep layer 10 extends along with the X direction, i.e., a direction perpendicular to the longitudinal direction of the trench 6. Multiple deep layers 10 are arranged along with the longitudinal direction of the trench 6. The deep layer 10 is deeper than the bottom of the trench 6. The depth of the deep layer 10 from the surface of the base region 3 is, for example, in a range between 2.6 micrometers and 3.0 micrometers. That is, the depth of the deep layer 10 from the bottom of the base region 3 is, for example, in a range between 0.6 micrometers and 1.0 micrometers. Further, the deep layer 10 has a P conductive type impurity concentration such as a boron or aluminum impurity concentration, which is set in a range between $1.0 \times 10^{17}/cm^3$ and $1.0 \times 10^{19}/cm^3$ in view of the withstand voltage so that the deep layer 10 reduces the electric field concentration in the gate oxide film 8 and protects from insulation breakdown. The deep layer 10 contacts the base region 3 so that the electric potential of the deep layer 10 is fixed to the same potential as the base region 3.

Further, a source electrode 11 and a gate wiring (not shown) are formed on the surface of the source region 4 and the contact layer and the surface of the gate electrode 9, respectively. The source electrode 11 and the gate wiring are made of multiple metals such as a Ni/Al film. Specifically, at least a part of the source electrode 11 and a part of the gate wiring, which contact the N conductive type SiC material such as the source region 4 and the gate electrode 9 in case of N conductive type impurity is doped, are made of metal capable of ohmic contacting with the N conductive type SiC. At least another part of the source electrode 11 and another part of the gate wiring, which contact the P conductive type SiC material such as the contact layer 5 and the gate electrode 9 in case of P conductive type impurity is doped, are made of metal capable of ohmic contacting with the P conductive type SiC. The source electrode 11 and the gate wiring are formed on an interlayer insulation film 12 so that the source electrode 11 and the gate wiring are insulated. The source electrode 11 is electrically coupled with the source region 4 and the contact layer 5 via a contact hole in the interlayer insulation film 12. The gate wiring is electrically coupled with the gate electrode 9 via another contact hole in the interlayer insulation film 12.

The drain electrode 13 is formed on the backside of the substrate 1 so that the drain electrode 13 is electrically coupled with the substrate 1. Thus, the N channel type inversion MOSFET having the trench gate structure is competed.

Thus, the N channel type inversion MOSFET having the trench gate structure is completed. In this case, the longitudinal direction of the trench gate structure is in parallel to the <1−100>-direction, which is perpendicular to the <11−20>-direction as the offset direction. Thus, the concavity and the convexity generated by the step bunching phenomena are not substantially formed on the sidewall and the bottom of the trench 6. The reason why the concavity and the convexity are not substantially formed on the sidewall and the bottom of the trench 6 will be explained as follows with reference to FIGS. 3A and 3B.

Figure 3A:
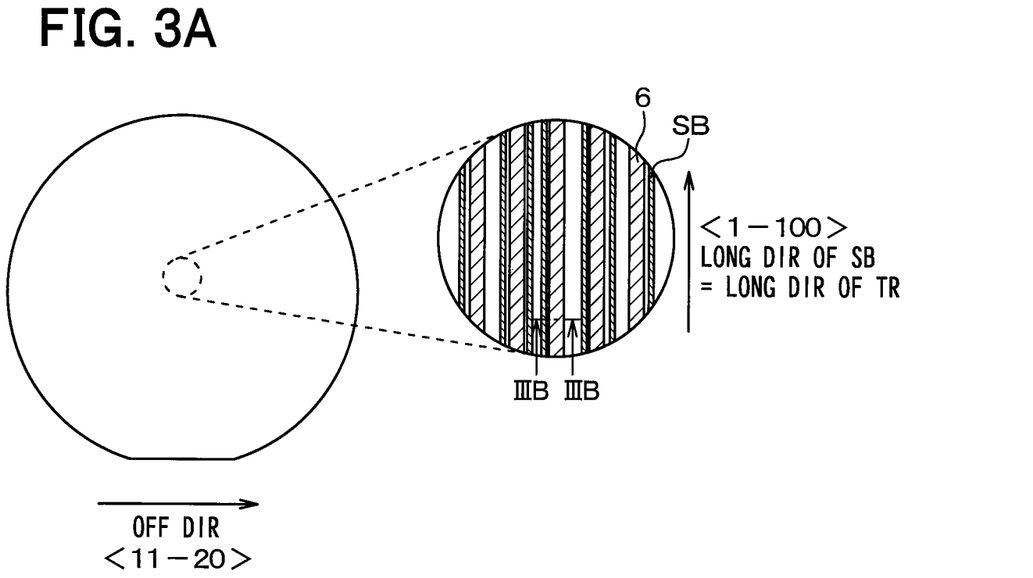
FIG. 3A is a diagram showing an upper surface layout of a SiC semiconductor substrate when a trench is formed.
Figure 3B:
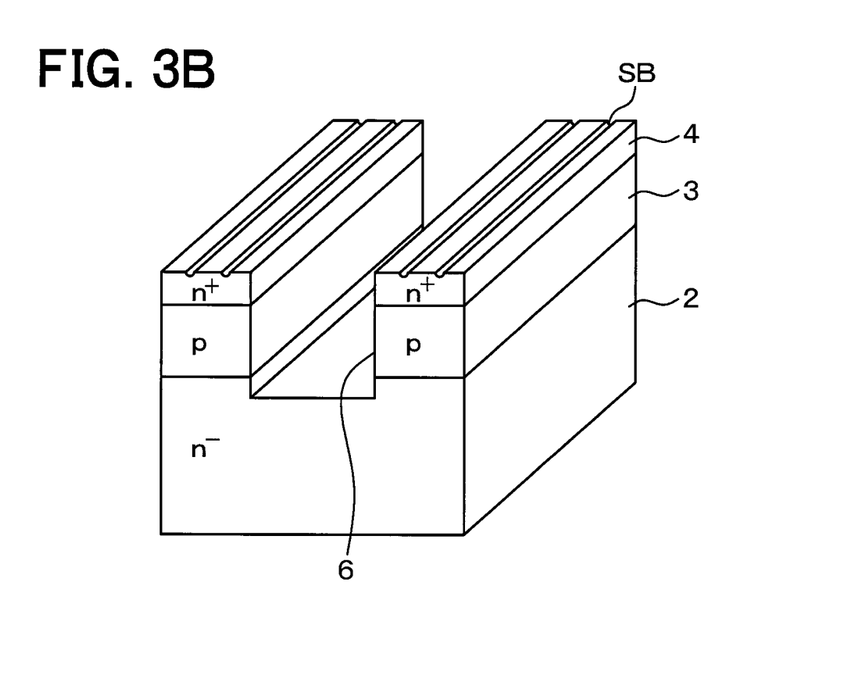
FIG. 3B is a diagram showing a cross sectional view of the substrate taken along line IIIB-IIIB in FIG. 3A.

FIG. 3A shows the upper surface of the SiC semiconductor substrate, in which the trench 6 is formed. FIG. 3B shows a cross sectional view of the substrate. As shown in FIGS. 3A and 3B, when the SiC semiconductor device is manufactured, the SiC semiconductor substrate is provided by a wafer. The offset direction of the wafer is the <11−20>-direction. The step bunching portion SB is formed in a direction perpendicular to the <11−20>-direction as the offset direction. Thus, the step bunching portion SB is in parallel to the longitudinal direction of the trench 6. Accordingly, the step bunching portion SB does not cross the trench 6, and the step bunching portion SB is formed substantially only on the surface of the SiC semiconductor substrate such as the surface of the source region 4. The step bunching portion SB is not formed on the inner wall of the trench 6. Thus, when the longitudinal direction of the trench 6 is in parallel to the <1−100>-direction, which is perpendicular to the <11−20>-direction, the step bunching portion SB is not substantially formed on the sidewall and the bottom of the trench 6.

Accordingly, the concavity and the convexity are not formed on the surface of the gate oxide film 8 disposed on the sidewall and the bottom of the trench 6. Thus, the insulation withstand voltage and the lifetime of the gate oxide film 8 are improved.

The inversion MOSFET having the trench gate structure functions as follows.

Before the gate voltage is applied to the gate electrode 9, the inversion layer is not formed in the deep layer 10 and the base region 3. Accordingly, even if the positive voltage is applied to the drain electrode 13, the electron does not reach from the source region 4 to the drift layer 2 through the base region 3. Thus, the current does not flow between the source region 11 and the drain electrode 13.

When the MOSFET is in an off state so that the gate voltage is zero volt, the drain voltage is 650 volts, and the source voltage is zero volt, even if the voltage is applied to the drain electrode 13, the bias of the MOSFET is reverse. Thus, a depletion layer expands between the base region 3 and the drift layer 2. At this time, since the concentration of the base region 3 is higher than the drift layer 2, the depletion layer expands almost in the drift layer 2. For example, when the impurity concentration of the base region 3 is ten times larger than the impurity concentration of the drift layer 2, the depletion layer extends in the base region 3 by 0.7 micrometers, and the depletion layer extends in the drift layer 2 by 7.0 micrometers. Since the thickness of the base region 3 is 2.0 micrometers, which is larger than the extension length of the depletion layer, the punch through phenomena does not occurs. Since the depletion layer extends compared with a case of zero volt, a region providing an insulator much expands. Thus, the current does not flow between the source electrode 11 and the drain electrode 13.

Since the gate voltage is zero volt, the electric field is applied between the drain and the gate. Accordingly, the electric field concentration may occur at the bottom of the gate oxide film 8. However, since the MOSFET includes the deep layer 10 deeper than the trench 6, the depletion layer at the PN junction between the deep layer 10 and the drift layer 2 largely expands in the drift layer 2. Thus, the high voltage caused by the influence of the drain voltage is not easily applied to the gate oxide film 8. Thus, the electric field concentration in the gate oxide film 8, specifically, the electric field concentration in the gate oxide film 8 at the bottom of the trench 6, is reduced. Thus, the breakdown at the gate oxide film 8 is prevented. Specifically, when the concavity and the convexity caused by the step bunching portion SB on the sidewall and the bottom of the trench 6 are not formed, the local electric field concentration in the gate oxide film 8 at the concavity and the convexity is prevented. Thus, the insulation withstand voltage and the lifetime of the gate oxide film 8 are improved.

When the MOSFET is in the on-state, i.e., when the gate voltage is 20 volts, the drain voltage is 1 volt, and the source voltage is 0 volt, the gate voltage of 20 volts is applied to the gate electrode 9. Thus, the channel is formed on the surface of the base region 3, which contacts the trench 6. Accordingly, the electron from the source electrode 11 flows from the source region 4 to the channel formed on the base region 3. Then, the electron reaches the drift layer 2. Thus, the current flows between the source electrode 11 and the drain electrode 13.

Next, a manufacturing method of the MOSFET having the trench gate structure will be explained as follows. FIGS. 4A to 5F show the manufacturing method of the MOSFET. FIGS. 4A to 4F are diagrams showing the manufacturing method of the MOSFET in FIG. 1, FIGS. 4A, 4C and 4E correspond to cross sectional views of the MOSFET taken along line IIB-IIB in FIG. 1 on the X-Z plane, and FIGS. 4B, 4D and 4F correspond to cross sectional views of the MOSFET taken along line IID-IID on the Y-Z plane in FIG. 1. FIGS. 5A to 5F are diagrams showing the manufacturing method of the MOSFET in FIG. 1, FIGS. 5A, 5C and 5E correspond to cross sectional views of the MOSFET taken along line IIB-IIB in FIG. 1 on the X-Z plane, and FIGS. 5B, 5D and 5F correspond to cross sectional views of the MOSFET taken along line IID-IID in FIG. 1 on the Y-Z plane.

Figure 4A:
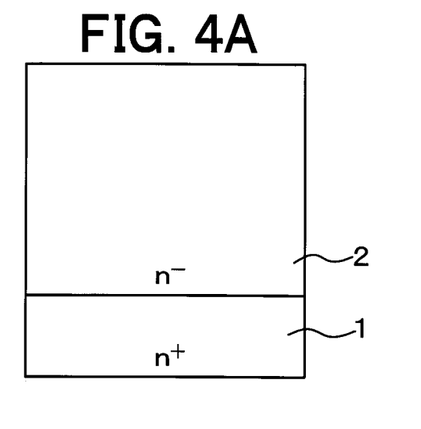
FIGS. 4A to 4F are diagrams showing a manufacturing method of the MOSFET in FIG. 1, FIGS. 4A, 4C and 4E correspond to cross sectional views of the MOSFET taken along line IIB-IIB in FIG. 1, and FIGS. 4B, 4D and 4F correspond to cross sectional views of the MOSFET taken along line IID-IID in FIG. 1.
Figure 4B:
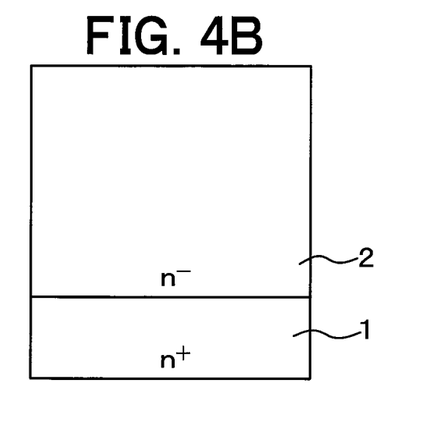

[Step in FIGS. 4A and 4B]

A N+ conductive type substrate 1 has the N conductive type impurity concentration such as a nitrogen impurity concentration of $1.0\times10^{19}/cm^3$ and the thickness of 300 micrometers. The drift layer 2 made of SiC is formed on the surface of the substrate 1 by an epitaxial growth method. The drift layer 2 has the N conductive type impurity concentration such as a nitrogen impurity concentration of $3.0\times10^{15}/cm^3$ to $2.0\times10^{16}/cm^3$ and the thickness of 15 micrometers.

Figure 4C:
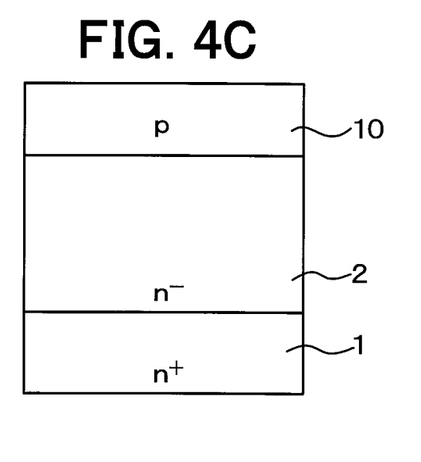
Figure 4D:
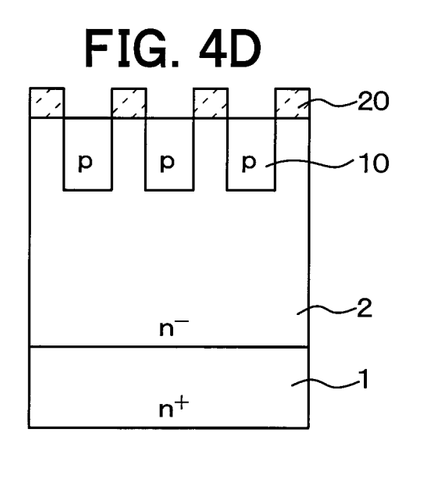

[Step in FIGS. 4C and 4D]

A mask 20 made of a LTO film is formed on the surface of the drift layer 2. After that, a photo lithography process is performed, so that a part of the mask 20 is opened. The part of the mask 20 corresponds to the deep-layer-to-be-formed region. Then, the P conductive type impurity such as boron or aluminum is implanted via the mask 20, and the P conductive type impurity is activated. Thus, the deep layer 10 is formed. For example, the boron or aluminum concentration is in a range between $1.0\times10^{16}/cm^3$ and $1.0\times10^{19}/cm^3$.

Figure 4E:
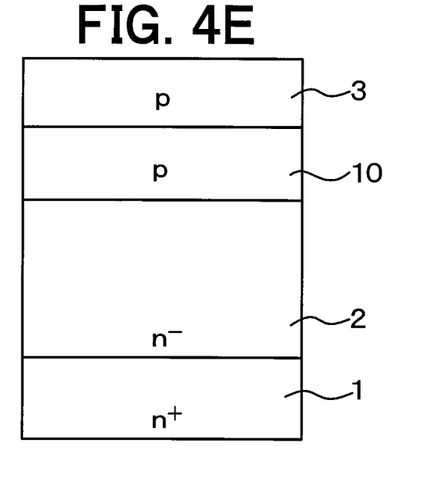
Figure 4F:
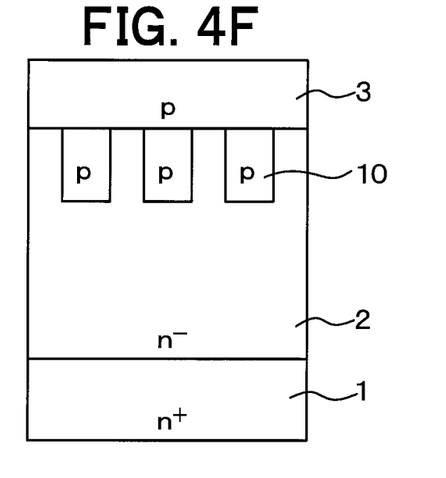

[Step in FIGS. 4E and 4F]

A P conductive type impurity layer is formed on the surface of the deep layer 10 and the drift layer 2 with the epitaxial growth method so that the base region 3 is formed. The P conductive type impurity layer has the P conductive type impurity concentration such as the boron or aluminum impurity concentration in a range between $1.0\times10^{15}/cm^3$ and $2.0\times10^{19}/cm^3$ and has the thickness of 2.0 micrometers.

Figure 5A:
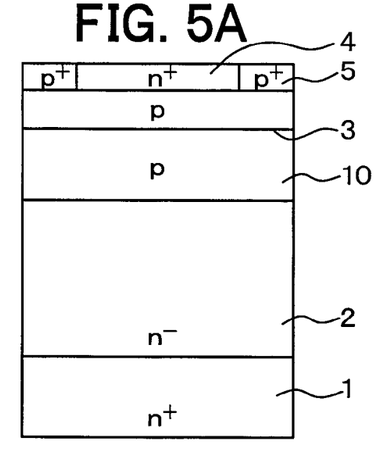
FIGS. 5A to 5F are diagrams showing the manufacturing method of the MOSFET in FIG. 1, FIGS. 5A, 5C and 5E correspond to cross sectional views of the MOSFET taken along line IIB-IIB in FIG. 1, and FIGS. 5B, 5D and 5F correspond to cross sectional views of the MOSFET taken along line IID-IID in FIG. 1.
Figure 5B:
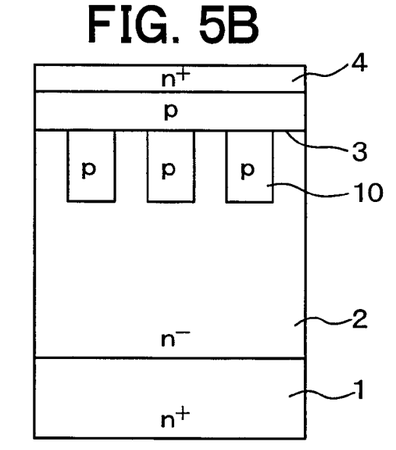

[Step in FIGS. 5A and 5B]

Then, a mask (not shown) made of a LTO film or the like is deposited on the base region 3. The photo lithography process is performed, so that a part of the mask is opened. The part of the mask corresponds to the source-region-to-be-formed region. Then, the N conductive type impurity such as nitrogen is implanted via the mask.

After the mask is removed, another mask (not shown) is deposited again. The photo lithography process is performed, so that a part of the mask is opened. The part of the mask corresponds to the contact-layer-to-be-formed region. Then, the P conductive type impurity such as boron or aluminum is implanted via the mask.

Then, the implanted ions are activated. Thus, the source region 4 having the N conductive type impurity concentration (i.e., the surface concentration) such as the nitrogen concentration of $1.0\times10^{21}/cm^3$ and the thickness about 0.3 micrometers is formed. Further, the contact layer 5 having the P conductive type impurity concentration (i.e., the surface concentration) such as the boron or aluminum concentration of $1.0\times10^{21}/cm^3$ and the thickness of 0.3 micrometers is formed. Then, the mask is removed.

Figure 5C:
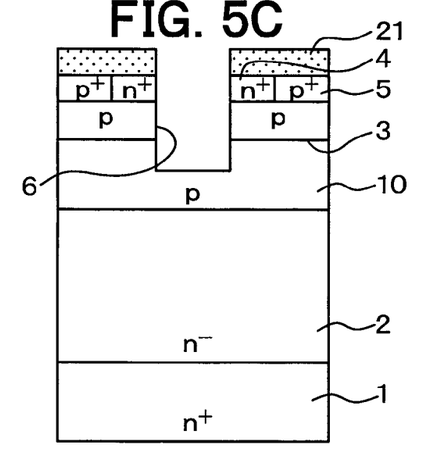
Figure 5D:
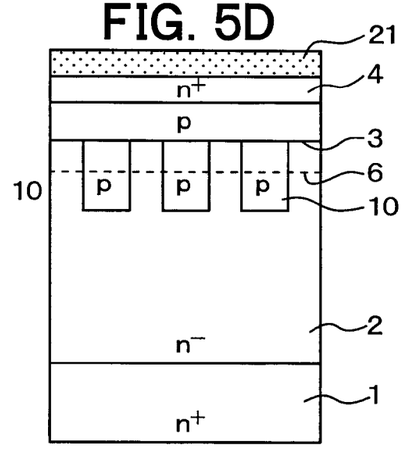

[Step in FIGS. 5C and 5D]

An oxide film 21 as an etching mask is formed on the base region 3, the source region 4 and the contact layer 5. Then, a part of the oxide film 21 is opened. The part of the oxide film 21 corresponds to the trench-to-be-formed region. After the etching process is performed with using the oxide film 21 as the etching mask, if necessary, a sacrifice oxidation process is performed. Thus, the trench 6 is formed. After that, the oxide film 21 is removed.

Figure 5E:
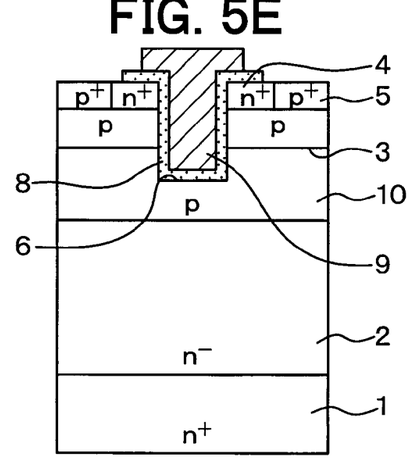
Figure 5F:
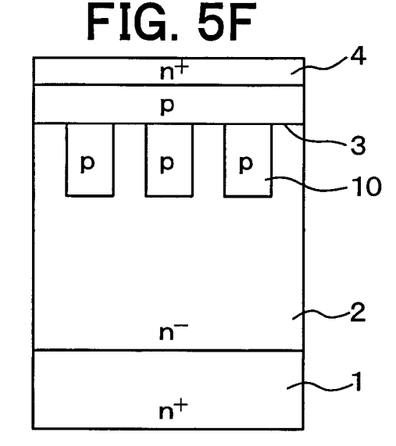

[Step in FIGS. 5E and 5F]

A gate oxide film is formed so that the gate oxide film 8 is disposed on a whole of the surface of the substrate including sidewalls of the trench 6. Specifically, the gate oxide film 8 is formed by a pyrogenic oxidation method in wet atmosphere. Thus, the gate oxide film 8 is a thermal oxidation film. Then, a poly silicon layer having the N conductive type impurity doped therein is formed on the surface of the gate oxide film 8 at 600° C. The thickness of the poly silicon layer is 440 nanometers. Then, an etch back process is performed. Thus, the gate oxide film 8 and the gate electrode 9 remain in the trench 6.

The following process is similar to a conventional method. Therefore, the following process is not shown in the drawing. Specifically, after the interlayer insulation film 12 is deposited, the interlayer insulation film 12 is patterned. Thus, the contact hole is formed in the interlayer insulation film 12. The contact hole provides to connect to the source region 4 and the contact layer 5. Further, another contact hole is formed in the interlayer insulation film 12. The other contact hole provides to connect to the gate electrode 9. Then, an electrode material is embedded in the contact holes. Further, the electrode material is patterned, so that the source electrode 11 and the gate wiring are formed. Further, the drain electrode 13 is formed on the backside of the substrate 1.

Thus, the MOSFET having the trench gate structure in FIG. 1 is manufactured by the above method. In steps of FIGS. 5A to 5D, an ion implantation process and an activation annealing process are performed in order to form an impurity layer. Further, an oxide film forming process, a photo lithography process, a mask forming process for pattering the oxide film, a trench etching process using the oxide film as a mask, and the like are performed in order to form a trench. At this time, in the present embodiment, the longitudinal direction of the trench gate structure is the <1-100>-direction, which is perpendicular to the <11-20>-direction as the offset direction. Thus, the concavity and the convexity caused by the step bunching phenomena are not substantially formed on the sidewall and the bottom of the trench 6.

Figure 6A:
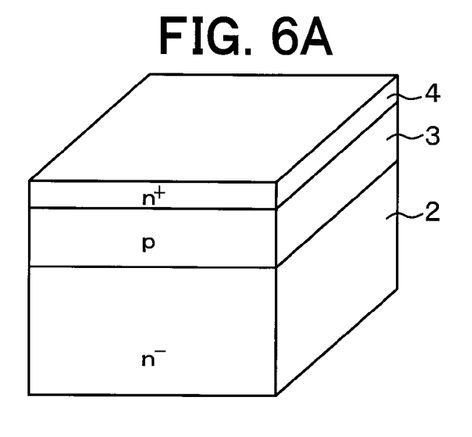
FIGS. 6A to 6F are diagrams showing perspective views of the MOSFET corresponding to the steps in FIGS. 5A to 5D.
Figure 6B:
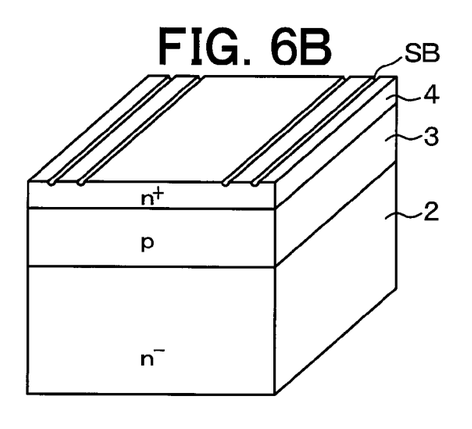
Figure 6C:
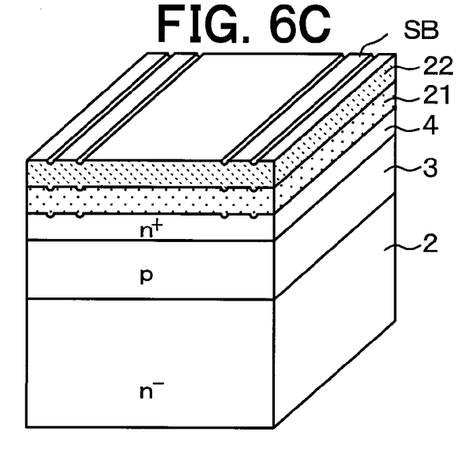
Figure 6D:
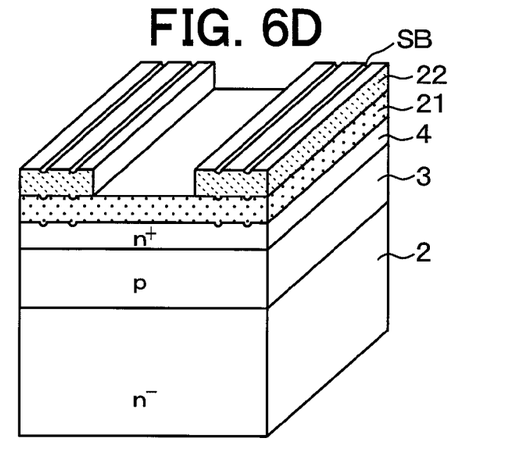
Figure 6E:
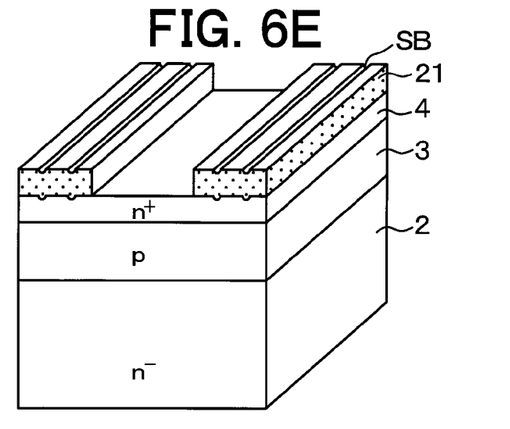
Figure 6F:
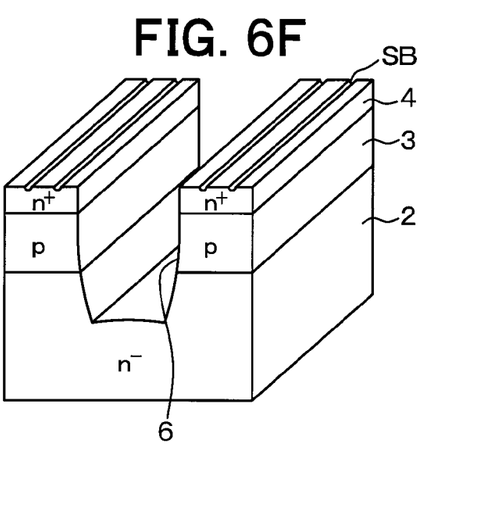

FIGS. 6A to 6F show perspective views of the MOSFET corresponding to the steps in FIGS. 5A to 5D. As shown in FIG. 6A, the N conductive type impurity is implanted in the base region 3 on the drift layer 2 so that the source region 4 is formed. Further, not shown in the drawing, the P conductive type impurity is implanted so that the contact layer 5 is formed. Then, the activation annealing process is performed. In the activation annealing process, the step bunching portion SB is formed, as shown in FIG. 6B. Then, as shown in FIG. 6C, the oxide film 21 and the resist 22 are formed. In this case, the convexity and the concavity according to the step bunching portion SB are transferred. As shown in FIG. 6D, the resist 22 is patterned with a photo-lithography method. Then, as shown in FIG. 6E, the oxide film 21 is etched with using the resist 22 as a mask. Further, as shown in FIG. 6F, the trench 6 is formed with using the oxide film 21 as a mask.

At this time, the trench 6 is formed using the oxide film 21 as an etching mask, on which the concavity and the convexity caused by the step bunching portion SB is transferred. In the present embodiment, the longitudinal direction of the trench gate structure is the <1-100>-direction, which is perpendicular to the <11-20>-direction as an offset direction. Thus, the longitudinal direction of the trench 6 is in parallel to the longitudinal direction of the step bunching portion SB. Thus, the step bunching portion SB does not cross the trench 6. Thus, as described above, the concavity and the convexity caused by the step bunching phenomena are not substantially formed on the sidewall and the bottom of the trench 6.

Thus, in the present embodiment, the trench 6 is formed to have the longitudinal direction in parallel to the <1-100>-direction, which is perpendicular to the <11-20>-direction as the offset direction of the SiC semiconductor substrate. Thus, the step bunching portion SB does not cross the trench 6.

The concavity and the convexity caused by the step bunching phenomena are not substantially formed on the sidewall and the bottom of the trench 6. Accordingly, the gate oxide film 8 formed on the sidewall and the bottom of the trench 6 is formed on the sidewall and the bottom of the trench 6 without including the concavity and the convexity. The reduction of the insulation withstand voltage and the lifetime of the gate oxide film 8 is restricted.

Second Embodiment

A second embodiment of the present disclosure will be explained. In the present embodiment, the offset direction and the longitudinal direction of the trench 6 are different from the first embodiment.

Figure 7:
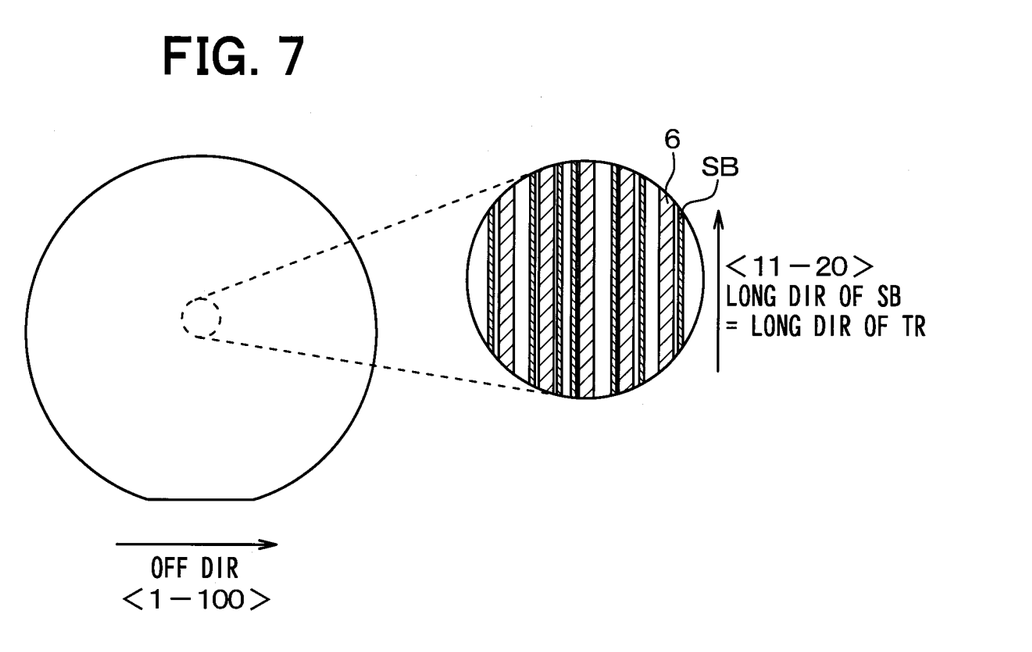
FIG. 7 is a diagram showing an upper surface layout of a SiC semiconductor substrate when a trench is formed.

FIG. 7 shows the upper surface layout of the SiC semiconductor substrate when the trench 6 is formed. As shown in FIG. 7, the offset direction of the SiC semiconductor substrate is the <1-100>-direction. In this case, the longitudinal direction of the trench 6 is the <11-20>-direction, which is perpendicular to the <1-100>-direction as the offset direction.

Thus, the offset direction the <1-100>-direction, and the longitudinal direction of the trench 6 is the <11-20>-direction. In this case, the effects similar to the first embodiment are obtained.

Other Embodiments

In the first embodiment, when the SiC semiconductor substrate has the Si-plane, the offset direction is the <11-20>-direction, and the longitudinal direction of the trench 6 is the <1-100>-direction. In the second embodiment, when the SiC semiconductor substrate has the Si-plane, the offset direction is the <1-100>-direction, and the longitudinal direction of the trench 6 is the <11-20>-direction. Alternatively, as long as the offset direction is perpendicular to the longitudinal direction of the trench 6, the longitudinal direction of the trench 6 may be any direction. Further, even when the SiC semiconductor substrate may have a C-plane instead of the Si-plane, the longitudinal direction of the trench 6 may be any direction as long as the offset direction is perpendicular to the longitudinal direction of the trench 6. For example, when the SiC semiconductor substrate has the C-plane, the offset direction may be the <11-20>-direction, and the longitudinal direction of the trench 6 may be the <1-100>-direction. Alternatively, even when the SiC semiconductor substrate has the C-plane, the offset direction may be the <1-100>-direction, and the longitudinal direction of the trench 6 may be the <11-20>-direction. Since the SiC semiconductor substrate is the offset substrate, the sidewall of the trench 6 has a plane, which slightly differs from a target plane by the offset angle. This causes the reduction of the channel mobility. However, when the C-plane is the principal surface, the reduction rate of the channel mobility in a case where the plane of the sidewall of the trench 6 slightly differs from the target plane by the offset angle is smaller than that with the principal plane of the Si-plane. Accordingly, when the SiC semiconductor substrate has the principal surface of the C-plane, the reduction of the channel mobility is much restricted.

In the above embodiments, the first conductive type is the N conductive type, and the second conductive type is the P conductive type, and the N channel MOSFET is used. Alternatively, the first conductive type may be the P conductive type, and the second conductive type may be the N conductive type, and the P channel MOSFET may be used. Further, in the above embodiments, the MOSFET has the trench gate structure. Alternatively, the silicon carbide semiconductor device may include an IGBT having a trench gate structure. Here, in the IGBT, the conductive type of the substrate 1 in FIGS. 1-7 is switched from the N conductive type to the P conductive type.

In the above embodiments, the gate insulation film is the gate oxide film 8 made by a thermal oxidation method. Alternatively, the gate insulation film may be the gate oxide film made by other methods. Alternatively, the gate insulation film may be a nitride film.

In the above embodiments, the orientation of the crystal is defined by adding a bar in front of a digit for reasons of expediency. The orientation of the crystal should be defined by adding a bar over the digit.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A silicon carbide semiconductor device having a vertical semiconductor element with a trench gate structure comprising:
- a silicon carbide semiconductor substrate including a first or second conductive type layer and a drift layer on the first or second conductive type layer, wherein the drift layer has the first conductive type, and the silicon carbide semiconductor substrate includes a principal surface having an offset direction;
- a trench disposed on a surface of the drift layer and having a longitudinal direction; and
- a gate electrode disposed in the trench via a gate insulation film,
- wherein a sidewall of the trench provides a channel formation surface,
- wherein the vertical semiconductor device is configured to flow current along with the channel formation surface of the trench according to a gate voltage applied to the gate electrode, and
- wherein the offset direction of the silicon carbide semiconductor substrate is perpendicular to the longitudinal direction of the trench.

2. The silicon carbide semiconductor device according to claim 1,
- wherein the principal surface of the silicon carbide semiconductor substrate is a silicon-plane,
- wherein the offset direction of the silicon carbide semiconductor substrate is a <11–20>-direction, and
- wherein the longitudinal direction of the trench is a <1–100>-direction.

3. The silicon carbide semiconductor device according to claim 1,
- wherein the principal surface of the silicon carbide semiconductor substrate is a silicon-plane,
- wherein the offset direction of the silicon carbide semiconductor substrate is a <1–100>-direction, and
- wherein the longitudinal direction of the trench is a <11–20>-direction.

4. The silicon carbide semiconductor device according to claim 1,
- wherein the principal surface of the silicon carbide semiconductor substrate is a carbon-plane,
- wherein the offset direction of the silicon carbide semiconductor substrate is a <11–20>-direction, and
- wherein the longitudinal direction of the trench is a <1–100>-direction.

5. The silicon carbide semiconductor device according to claim 1,
- wherein the principal surface of the silicon carbide semiconductor substrate is a carbon-plane,
- wherein the offset direction of the silicon carbide semiconductor substrate is a <1–100>-direction, and
- wherein the longitudinal direction of the trench is a <11–20>-direction.

6. The silicon carbide semiconductor device according to claim 1, further comprising:
- a drain electrode disposed on the first or second conductive type layer opposite to the drift layer;
- a base region disposed in a surface portion of the drift layer;
- a source region disposed in a surface portion of the base region;
- a contact layer disposed in another surface portion of the base region adjacent to the source region; and
- a source electrode disposed on the source region and the contact layer so that the source electrode is electrically coupled with the source region and the contact layer,
- wherein the trench penetrates the source region and the base region, and reaches the drift layer, and
- wherein contact layer is disposed on both sides of the trench via the source region.

7. The silicon carbide semiconductor device according to claim 6, further comprising:
- a deep layer disposed in the drift layer under the base region,
- wherein the deep layer contacts the base region, and
- wherein the deep layer has an extending direction, which is perpendicular to the longitudinal direction of the trench.

* * * * *